US006774019B2

(12) United States Patent
Choate, IV et al.

(10) Patent No.: US 6,774,019 B2
(45) Date of Patent: Aug. 10, 2004

(54) INCORPORATION OF AN IMPURITY INTO A THIN FILM

(75) Inventors: Charles Augustus Choate, IV, Underhill, VT (US); Timothy S. Hayes, Hinesburg, VT (US); Michael Raymond Lunn, Georgia, VT (US); Paul R. Nisson, Colchester, VT (US); Dean W. Siegel, Colchester, VT (US); Michael C. Triplett, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/063,846

(22) Filed: May 17, 2002

(65) Prior Publication Data

US 2003/0213433 A1 Nov. 20, 2003

(51) Int. Cl.[7] .............................................. C23C 16/44
(52) U.S. Cl. ...................... 438/510; 117/84; 117/104; 427/249.1; 427/255.18; 427/255.23; 427/255.39; 427/5

(58) Field of Search ............................. 438/510; 117/84, 117/104; 427/299.1, 255.18, 255.33, 255.395

(56) References Cited

U.S. PATENT DOCUMENTS

| 4,664,063 A | * | 5/1987 | Ashizawa et al. ........... 118/724 |
| 4,891,332 A |   | 1/1990 | Bloem et al. ................ 437/165 |
| 4,968,384 A |   | 11/1990 | Asano ......................... 156/643 |
| 5,354,696 A |   | 10/1994 | Oostra et al. ................. 437/18 |
| 5,441,901 A |   | 8/1995 | Candelaria ................... 437/31 |
| 6,337,102 B1 | * | 1/2002 | Forrest et al. ................ 427/64 |
| 2002/0152951 A1 | * | 10/2002 | Tsvetkov et al. ............. 117/84 |

* cited by examiner

Primary Examiner—Timothy Meeks
(74) Attorney, Agent, or Firm—Anthony J. Canale

(57) ABSTRACT

The present invention describes a method of forming a thin film on a substrate arranged in a deposition system comprising the step of introducing a pre-determined amount of an impurity in a confined volume in the deposition system. One or more gases are introduced into the deposition system for forming the thin film. The impurity is removed from the confined volume in a gas phase during formation of the thin film. The impurity in the gas phase is incorporated into the thin film.

12 Claims, 2 Drawing Sheets

INCORPORATION OF AN IMPURITY INTO A THIN FILM

BACKGROUND OF THE INVENTION

1. Field of the Invention

The field of the invention is semiconductor processing. Specifically, the invention relates to incorporation of an impurity into a semiconductor film.

2. Background of the Invention

Incorporation of an impurity (such as carbon) into semiconductor films has proved beneficial in enhancing the electrical characteristics of devices such as heterojunction bipolar transistors and solar cells. In general, such improvements are achieved by modifying the mobility of carriers or the bandgap of the semiconductor material.

A low pressure chemical vapor deposition (LPCVD) in a single wafer or a multi-wafer deposition tool can be used to form an epitaxial silicon or polysilicon film. In order to introduce an impurity during the silicon growth process, a conventional polysilicon LPCVD process in a multi-wafer deposition tool utilizes a carrier gas to dilute an impurity-containing gas in order to achieve a desired concentration of impurity in the silicon film. Alternatively, a small flow controller can be used to control the flow of the impurity-containing gas into the deposition tool without a carrier gas.

As semiconductor devices decrease in size and requirements to improve device performance increase, lower concentrations of impurities in epitaxial or polycrystalline silicon films are required. For the carrier gas method, increasing the amount of the carrier gas to further dilute the impurity-containing gas adversely affects the polysilicon deposition process by modifying the reaction thermodynamics and kinetics. Moreover, dilution of the impurity-containing gas decreases the partial pressure of the reactant gas, thus slowing down the reaction to form the polysilicon film resulting in an increase in process time. Still further, the reduction in the growth rate of the polysilicon film can adversely affect the desired grain structure of the polysilicon film.

Another option is to simply decrease the flow of the impurity gas. However, at such low concentrations it is very difficult to control the amount of impurity incorporated into the silicon film. In addition, both the carrier gas and the decreased impurity gas flow methods involve delivery of the impurity-containing gas from an impurity-containing gas source external to the deposition tool, which increases the complexity of the deposition tool.

Accordingly, a need has developed in the art for a process of incorporation of an impurity in a thin film without adversely affecting the deposition process.

BRIEF SUMMARY OF THE INVENTION

It is thus an object of the present invention to provide a method for incorporating an impurity in a thin film without adversely affecting the deposition process.

It is another object of the present invention to incorporate an impurity without increasing carrier gas flow or decreasing dopant gas flow.

The foregoing and other objects of the invention are realized, in a first aspect, by providing an impurity cell in a deposition chamber and desorbing impurity in a gas phase from the impurity cell into the deposition chamber, wherein the impurity is incorporated into the thin film.

In a second aspect, the invention is realized by providing an impurity cell in a deposition chamber and desorbing impurity in a gas phase from the impurity cell into the deposition chamber, wherein the impurity is incorporated into the thin film, and replenishing the impurity cell in the deposition chamber.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE INVENTION

Detailed Description of the Preferred Embodiments of the Invention

The invention describes a method of providing an impurity cell within a deposition system to provide an impurity gas during a thin film deposition process. For example, in a silicon deposition process, a carbon cell can include a block of material, such as roughened stainless steel, dipped into a carbon-containing liquid with a low volatility, such as liquid hexane, where the liquid hexane adheres to the block. The block with the adhered liquid hexane is then placed within the process chamber and the liquid hexane desorbs from the block due to vacuum in the process chamber. The desorbed carbon-containing gas decomposes into the elemental constituents hydrogen $(H)_2$ and carbon (C). Hydrogen is inert in the silicon reaction while carbon is incorporated into the silicon thin film. The present invention allows carbon to be incorporated into the silicon thin film without introducing a carbon-containing gas from a source external to the process chamber. The need for a carrier gas to dilute a carbon-containing gas or a small flow controller to control the flow of a carbon-containing gas is eliminated in the present invention.

Figure 1:
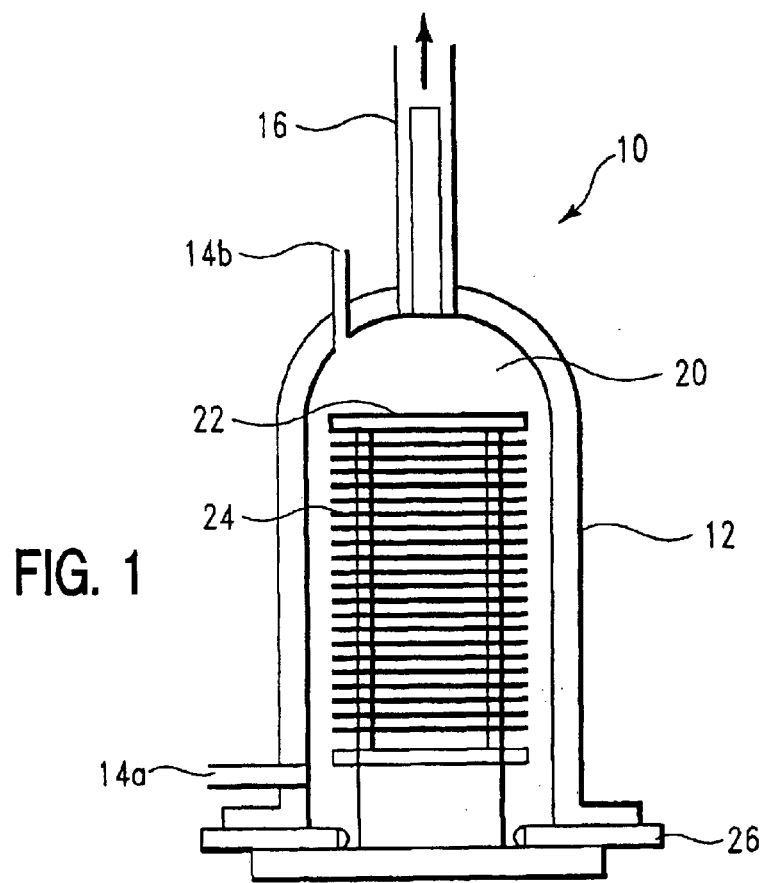
FIG. 1 is a schematic view of a process chamber incorporating the impurity cell according to an embodiment of the present invention.

A first embodiment of the present invention will be described with reference to process system 10 as shown in FIG. 1. Process system 10 represents a vertical furnace vacuum deposition system capable of simultaneously processing multiple substrates during a processing step. It should be understood that the present invention is not limited to a process system comprising a vertical furnace. The present invention can also be applied to a process system comprising a horizontal furnace vacuum deposition system for simultaneously processing multiple substrates, a single wafer vacuum deposition system for processing one substrate during a processing step, or other deposition systems where thin films are formed such as a sputter deposition system. In addition, the present invention is not limited to a process system comprising a vacuum system. The present invention can also be applied to a process system comprising a partial vacuum such as a sub-atmospheric (SA) system for SACVD, or atmospheric pressure or above such as a rapid thermal process (RTP) system for steam RTCVD. Process system 10 can be used to form thin films such as magnetic thin films, insulator thin films, or semiconductor thin films.

Process system 10 comprises chamber wall 12, process gas inlets 14a and 14b, and gas exhaust outlet 16. Process chamber 20 comprises the volume formed within chamber wall 12 where processing occurs. Within process chamber 20, substrate pedestal 22 holds substrates 24 in place during processing. Impurity cell 26 is located within process chamber 20 below substrates 24. Impurity cell 26 can be used to provide an impurity such as a dopant or non-dopant for incorporation into a semiconductor thin film. As utilized in this description, a "dopant" is an element which alters the equilibrium electron or hole concentration in an intrinsic semiconductor film. Dopant elements include boron, phosphorous and arsenic. A "non-dopant" is an element that does not add to or subtract from the equilibrium carrier concentration in an intrinsic semiconductor film. Additionally, a non-dopant does not alter the density or location of states of the intrinsic semiconductor film. Non-dopant elements include carbon and germanium (Ge). While an embodiment of the present invention will be described in terms of incorporating a non-dopant, such as carbon, in a semiconductor thin film, dopants could also be so incorporated.

For a semiconductor thin film such as epitaxial or polycrystalline silicon, process system 10 can be used to provide carbon concentrations from about 1×10 to the $13^{th}$ power atoms per cubic centimeter (such parameters being abbreviated hereafter as "1E13 atoms/cm3") to about 1E17 atoms/cm3. Process system 10 can also be used to provide carbon concentrations up to about a maximum solid solubility of carbon in silicon.

Carbon cell 26 located within process chamber 20 provides a pre-determined amount of carbon in a confined volume without requiring an external gas line for a carbon-containing gas, a carrier gas for diluting the carbon-containing gas, or small flow controller for controlling the flow of the carbon-containing gas. Carbon cell 26 comprises a liquid, a solid, a liquid adhering to a solid, or a gas adhering to a solid.

Figure 2:
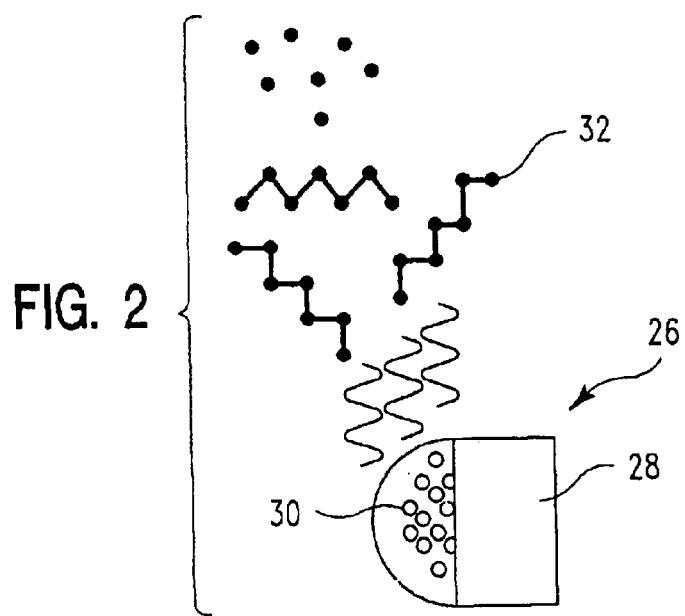
FIG. 2 is a generalized illustration of the operation of the impurity cell according to the present invention.

FIG. 2 illustrates an example of a liquid delivery system as utilized in an embodiment of the invention. A block of material 28 with porous, curvaceous, or pitted features 30 to form a high surface area is submersed into a carbon-containing liquid having a low volatility, such as liquid hexane, and is removed from the carbon-containing liquid. Block 28 can be made of metal, ceramic, Teflon or any material that can withstand the processing temperatures. For processing temperatures exceeding 400 degrees C., block 28 can be made of stainless steel, alumina, silica or zirconia. Carbon-containing liquid adheres to the surface of block 28 resulting in carbon cell 26. Carbon cell 26 is then placed into process chamber 20.

For a silicon deposition process, process chamber 20 is pumped down to a pressure between about 100 mTorr to about 200 mTorr, preferably to about 150 mTorr. At a pressure of about 150 mTorr, liquid hexane desorbs from block 28 resulting in carbon-containing gas 32 due to low pressure in process chamber 20. Likewise, block 28 can be heated to a temperature sufficient to result in liquid hexane evaporating, or desorbing, from block 28 resulting in carbon-containing gas 32. At processing temperatures of about 400 degrees C. or higher near substrates 24, carbon-containing gas 32 decomposes into the elemental constituents hydrogen and carbon. Hydrogen is inert in the silicon reaction while carbon is incorporated into the silicon film. The method of the present invention provides concentrations of carbon as low as about 1E13 atoms/cm3 and up to about the solid solubility limit of carbon in silicon to be incorporated into an epitaxially or polycrystalline grown silicon film. The complexity of process system 10 is simplified compared to conventional deposition systems since additional gas lines for both a carbon-containing gas and a carrier gas connected to process system 10 are not required.

As subsequent process runs occur in process chamber 20, desorption from carbon cell 26 depletes the amount of liquid hexane available as a carbon source resulting in a reduction of carbon-containing gas 32 during the deposition process. The lifetime of carbon cell 26 depends on factors such as the desired carbon concentration and the number of substrates processed. For example, for low carbon concentrations from about 1E14 atoms/cm3 to about 1E16 atoms/cm3 and for loads of about 100 wafers every eight hours, the lifetime of carbon cell 26 is in the range of about one to about three weeks. Carbon cell 26 is recharged by removal from process chamber 20 and re-submersed into liquid hexane. Once again, liquid hexane adheres to the surface of block 28 resulting in recharged carbon cell 26. Recharged carbon cell 26 is placed into process chamber 20.

The amount of liquid hexane adhering to the surface of block 28 which is required to achieve a desired carbon concentration in a silicon film can be determined through experimentation by modifying the amount of liquid hexane adhering to block 28 and/or modifying the surface area of block 28 based on measured carbon concentration values in the silicon film. Carbon cell 26 is modified until the desired carbon concentration value in the silicon film is achieved. Once the amount of liquid hexane and/or the surface area of block 28 to achieve a desired carbon concentration value in the silicon film are determined, these parameters are documented so that recharging of carbon cell 26 can occur without experimentation for subsequent silicon depositions requiring the same carbon concentration value.

The present invention is not limited to carbon cell 26 comprising block 28 with a carbon-containing liquid adhering to block 28. Carbon cell 26 can comprise a liquid, a solid, or a gas adhering to a solid. For example, a liquid carbon cell can include a stainless steel container filled with a liquid alkane (pentane, hexane, heptane, octane, nonane, etc.); a solid carbon cell can include polymers such as polyethylene; or, 'a gas adhering to a solid' carbon cell can include methane, ethane, propane or butane gas sprayed onto block 28. Any of the above described carbon cells can be used to provide a source of carbon gas in process chamber 20. For the case of a liquid carbon cell or 'a gas adhering to a solid' carbon cell, low pressure vacuum conditions in process chamber 20 will result in desorption of the carbon-containing liquid or gas to provide carbon-containing gas 32 during the deposition process. Likewise, increasing the temperature of the stainless steel container of the liquid carbon cell or block 28 of 'gas adhering to a solid' carbon cell will result in desorption of the carbon-containing liquid or gas to provide carbon-containing gas 32. For the case of a solid carbon cell, heating the solid to a temperature that is high enough for the solid to evaporate will provide carbon-containing gas 32 during the deposition process. For a partial vacuum system such as a sub-atmospheric (SA) system for SACVD or an atmospheric pressure system such as a rapid thermal process (RTP) system for steam RTCVD where pressure conditions are not adequate to result in desorption from the carbon cell 26, increasing the temperature of carbon cell 26 will result in desorption of the carbon-containing liquid or gas to provide carbon-containing gas 32.

Figure 3:
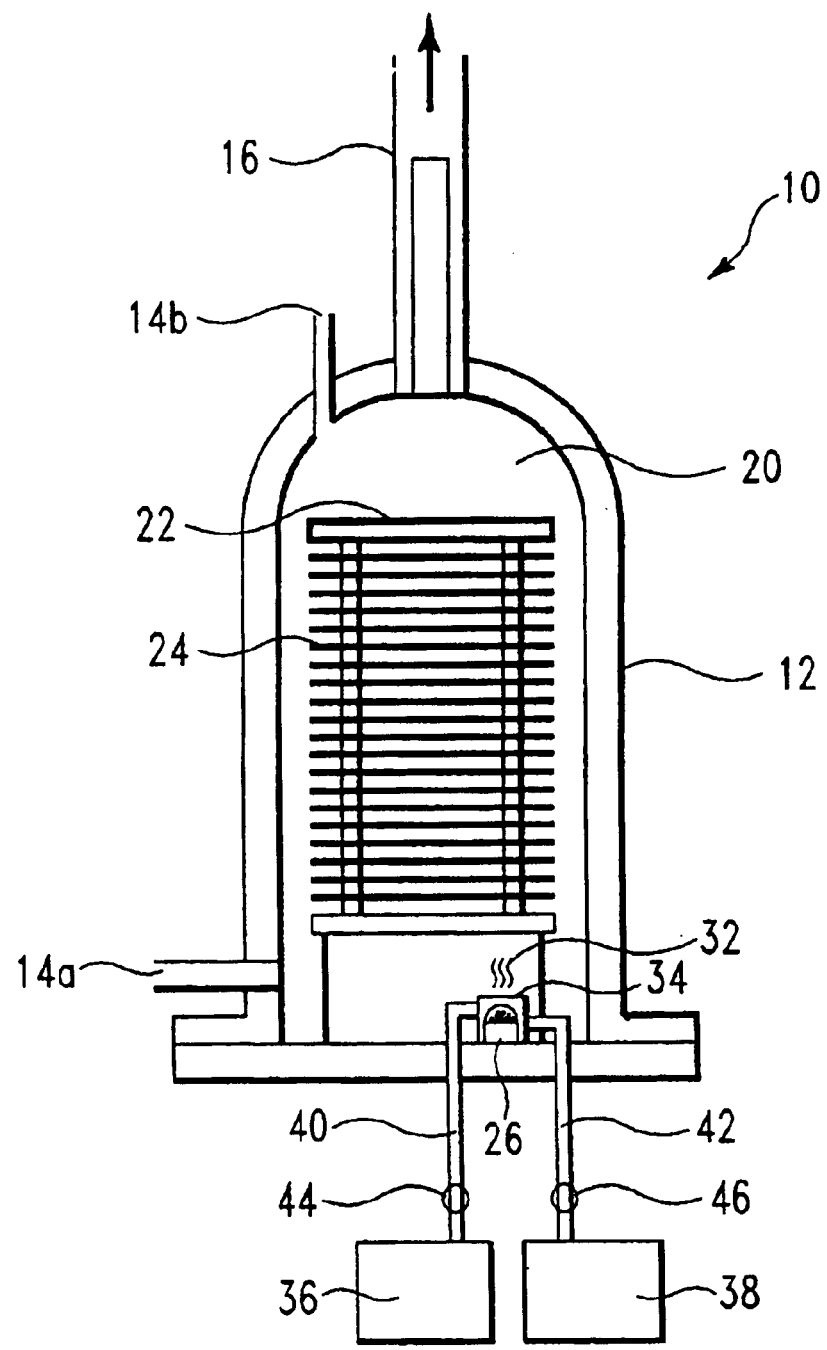
FIG. 3 is a schematic view of a process chamber illustrating a second embodiment of the present invention.

According to a second embodiment of the present invention as shown in FIG. 3, carbon cell 26 can be charged (i.e., replenished) without being removed from process system 10. For a 'liquid adhering to a solid' carbon cell 26 such as liquid hexane adhering to a block, carbon cell 26 is placed within enclosure 34. Enclosure 34 has openings so that carbon-containing gas 32 can diffuse into process chamber 20. Carbon source 36 is connected to enclosure 34 via connector 40 and overflow chamber 38 is also connected to enclosure 34 via connector 42. Carbon cell 26 is recharged by opening valve 44 and flowing liquid hexane through connector 40 into enclosure 34 to a desired level. Valve 44 is closed and then valve 46 is opened to remove any excess liquid hexane from enclosure 34 through connector 42 to overflow chamber 38. Valve 46 is then closed. With both valves 44 and 46 closed, carbon source 36 and overflow chamber 38 are isolated from process chamber 20 during the film deposition process.

Likewise, for a liquid carbon cell 26, enclosure 34 can be filled with liquid hexane to a desired level from carbon source 36 through connector 40. As liquid hexane desorbs from enclosure 34, carbon source 36 can replenish the liquid hexane to the desired level in enclosure 34.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, the present invention can also be used to incorporate a dopant, such as boron, phosphorous or arsenic, into a thin film. A dopant gas such as diborane, phosphene or arsene can be sprayed onto a block to create a 'gas adhering to a solid' dopant cell which can be placed in a process chamber. At low pressure, dopant gas desorbs from the dopant cell and is incorporated into the thin film.

What is claimed is:

1. A method of incorporating an impurity in a thin film comprising the steps of:
   providing a deposition chamber;
   providing a substrate arranged in the deposition chamber;
   providing an impurity cell which introduces a pre-determined amount of an impurity in the deposition chamber;
   providing an impurity source coupled to the impurity cell;
   isolating the impurity source from the impurity cell and the deposition chamber, and delivering impurity in a gas phase from the impurity cell into the deposition chamber,
   introducing one or more gases into the deposition chamber for forming the thin film, wherein the impurity in the gas phase is incorporated into the thin film; and,
   isolating the deposition chamber from the impurity cell and the impurity source, and charging the impurity cell with impurity from the impurity source.

2. The method of claim 1, wherein in the stop of charging the impurity cell from the impurity source, the impurity cell remains in the deposition chamber.

3. The method of claim 1, wherein the impurity cell comprises a liquid, a solid, a liquid adhering to a solid or a gas adhering to a solid.

4. The method of claim 1, wherein the step of delivering the impurity comprises desorbing the impurity from the impurity cell.

5. A method of incorporating an impurity in a thin film comprising the steps of:
   providing a substrate to a deposition chamber,
   providing an impurity cell to the deposition chamber, the impurity cell having a pre-determined amount of an impurity in a confined volume;
   introducing one or more gases into the deposition chamber for forming the thin film, wherein the thin film comprises epitaxial or polycrystalline silicon; and
   removing the impurity from the impurity cell in a gas phase, wherein the impurity in the gas phase is incorporated into the thin film.

6. The method of claim 5, wherein the impurity is selected from the group consisting of carbon and germanium.

7. The method of claim 5, wherein the impurity incorporated into the epitaxial or polycrystalline silicon thin film comprises carbon in a concentration from about 1E13 atoms/cm3 to a maximum solubility of carbon in the silicon thin film.

8. The method of claim 5, wherein the impurity cell comprises a liquid, a solid, a liquid adhering to a solid, or a gas adhering to a solid.

9. The method of claim 5, wherein the step of removing the impurity comprises desorbing the impurity from the impurity cell by providing a vacuum surrounding the impurity cell.

10. The method of claim 5, wherein the step of removing the impurity comprises desorbing the impurity from the impurity cell by increasing the temperature of the impurity cell.

11. The method of claim 5, wherein the deposition chamber comprises a vacuum chamber.

12. The method of claim 5, wherein the confined volume is located entirely within the deposition chamber.

* * * * *